(12) United States Patent
Numazawa et al.

(10) Patent No.: US 10,618,285 B2
(45) Date of Patent: Apr. 14, 2020

(54) PIEZOELECTRIC SUBSTRATE AND METHOD OF MANUFACTURING THE PIEZOELECTRIC SUBSTRATE, AND LIQUID EJECTION HEAD

(71) Applicant: CANON KABUSHIKI KAISHA, Tokyo (JP)

(72) Inventors: Hiroto Numazawa, Yuki (JP); Minako Nakasu, Tokyo (JP); Motokazu Kobayashi, Yokohama (JP); Yoshihiro Ohashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 485 days.

(21) Appl. No.: 15/608,111

(22) Filed: May 30, 2017

(65) Prior Publication Data
US 2017/0365773 A1    Dec. 21, 2017

(30) Foreign Application Priority Data

Jun. 17, 2016  (JP) ................... 2016-120507
Feb. 10, 2017  (JP) ................... 2017-023044

(51) Int. Cl.
*H01L 41/187*  (2006.01)
*H01L 41/09*   (2006.01)
(Continued)

(52) U.S. Cl.
CPC ............ *B41J 2/161* (2013.01); *B41J 2/1642* (2013.01); *B41J 2/1645* (2013.01); *B41J 2/1646* (2013.01);
(Continued)

(58) Field of Classification Search
CPC ........ B41J 2/161; B41J 2/1642; B41J 2/1645; B41J 2/1646; B41J 2202/03;
(Continued)

(56) References Cited

U.S. PATENT DOCUMENTS 6,097,133 A    8/2000  Shimada et al.
6,294,860 B1   9/2001  Shimada et al.
(Continued)

FOREIGN PATENT DOCUMENTS

JP   2003-3347613 A  * 12/2003  ............ H01L 41/08
JP   3890634 B2       3/2007
(Continued)

OTHER PUBLICATIONS

D. Ambika et al., "Deposition of PZT Thin Films with {001}, {110}, and {111} Crystallographic Orientations and Their Transverse Piezoelectric Characteristics," 3(2) Adv. Mat. Lett. 102-106 (2012).

(Continued)

*Primary Examiner* — Thomas M Dougherty
(74) *Attorney, Agent, or Firm* — Venable LLP (57) ABSTRACT

Disclosed is a method of manufacturing a piezoelectric substrate, the method including: forming an intermediate layer of Ti and a lower electrode of Pt oriented in a (111) axis direction on a substrate without heating the substrate; applying a coating liquid for forming an orientation control layer made of lead titanate onto the lower electrode; drying the coating liquid at a predetermined temperature to form an orientation control layer precursor made of lead titanate; applying a coating liquid for forming a piezoelectric thin film made of lead zirconate titanate; drying the coating liquid at a predetermined temperature to form a piezoelectric precursor made of a lead zirconate titanate precursor; and collectively firing the orientation control layer precursor and the piezoelectric precursor to crystallize both the precursors, to thereby form a piezoelectric thin film made of lead zirconate titanate preferentially oriented in a (110) plane.

3 Claims, 6 Drawing Sheets

(51) Int. Cl.
  *B41J 2/16* (2006.01)
  *H01L 41/08* (2006.01)
  *H01L 41/318* (2013.01)
  *H01L 41/319* (2013.01)

(52) U.S. Cl.
  CPC ...... *H01L 41/0815* (2013.01); *H01L 41/0973* (2013.01); *H01L 41/1876* (2013.01); *H01L 41/318* (2013.01); *H01L 41/319* (2013.01); *B41J 2202/03* (2013.01)

(58) Field of Classification Search
  CPC ............ H01L 41/0815; H01L 41/0973; H01L 41/1876; H01L 41/318; H01L 41/319
  USPC .................................................. 310/328, 358
  See application file for complete search history.

(56) References Cited

U.S. PATENT DOCUMENTS

| | | | |
|---|---|---|---|
| 6,387,225 | B1 | 5/2002 | Shimada et al. |
| 7,187,024 | B2 | 3/2007 | Kobayashi et al. |
| 7,399,066 | B2 | 7/2008 | Kubota et al. |
| 7,399,067 | B2 | 7/2008 | Kubota et al. |
| 7,456,548 | B2 | 11/2008 | Kubota et al. |
| 8,227,021 | B2 | 7/2012 | Kubota et al. |
| 8,715,823 | B2 | 5/2014 | Kubota et al. |
| 8,951,603 | B2 | 2/2015 | Watanabe et al. |
| 9,437,806 | B2 | 9/2016 | Kobayashi et al. |
| 2013/0093290 | A1* | 4/2013 | Fox ........................ H01L 41/081 310/357 |
| 2013/0249354 | A1* | 9/2013 | Watanabe ............... H01L 41/18 310/369 |
| 2015/0104637 | A1 | 4/2015 | Watanabe et al. |
| 2015/0231884 | A1* | 8/2015 | Kobayashi ........... B41J 2/14201 347/70 |
| 2016/0339702 | A1 | 11/2016 | Kobayashi et al. |
| 2018/0138393 | A1* | 5/2018 | Sumi .................... B41J 2/14233 |

FOREIGN PATENT DOCUMENTS

| | | |
|---|---|---|
| JP | 4516166 B2 | 8/2010 |
| JP | 5509419 B2 | 6/2014 |
| JP | 5828293 B2 | 12/2015 |

OTHER PUBLICATIONS

D. Ambika et al., "Sol-gel Deposition and Piezoelectric Properties of {110}-Oriented Pb(Zr0.52Ti0.48)O3Pb(Zr0.52Ti0.48)O3 Thin Films," 96 Appl. Phys. Lett. 031909-01-031909-03 (Jan. 2010).

Kunitaka Fujiyoshi et al., "Preparation and Characterization of Orientation-Controlled PZT Thin Films by Sol-gel Method," Fukuoka Industrial Technology Center Research Report No. 15, pp. 1-4 (2005) (URL: http://www.fitc.pref.fukuoka.jp/kenkyu/report/h16/h16-4.pdf).

Kobayashi et al., U.S. Appl. No. 15/493,426, filed Apr. 21, 2017.

* cited by examiner

PIEZOELECTRIC SUBSTRATE AND METHOD OF MANUFACTURING THE PIEZOELECTRIC SUBSTRATE, AND LIQUID EJECTION HEAD

BACKGROUND OF THE INVENTION

Field of the Invention

The present invention relates to a piezoelectric substrate including a piezoelectric thin film preferentially oriented in a (110) plane, a method of manufacturing the piezoelectric substrate, and a liquid ejection head.

Description of the Related Art

As a piezoelectric material, barium titanate, lead titanate, and lead zirconate titanate (PZT) have been used. Of those, lead zirconate titanate has a large piezoelectric constant and a high Curie temperature, and hence lead zirconate titanate has been applied to various fields regardless of the shape such as a bulk and a thin film.

As one of the applications, there is a disclosure of an ink jet recording head in which an element using a piezoelectric thin film is incorporated (Japanese Patent No. 3890634). In order for a piezoelectric thin film used in this application to exhibit a sufficient electromechanical transduction function (pressure for urging displacement), it is necessary that the piezoelectric thin film have a thickness of from about 1 µm to about 25 µm. Further, in order to control displacement accurately, it is desired that the piezoelectric thin film be uniform.

As a method of manufacturing such piezoelectric thin film, there are given a sputtering method, a metal organic chemical vapor deposition (MOCVD) method, a sol-gel method, and the like. In particular, the sol-gel method does not require a large-scale facility and enables a film to be formed in a large area with satisfactory reproducibility, though it is difficult to form a thick film at a time. Further, the sol-gel method is useful from the viewpoint of being capable of significantly decreasing a crystallization temperature.

Further, regarding the orientation of a crystal of a piezoelectric thin film containing PZT or the like formed by the sol-gel method, as the ratio of a (100) orientation becomes higher than those of other orientations, for example, a (111) orientation and a (110) orientation, the direction of a polarization moment significantly approaches the deformation direction of a piezoelectric material. As a result, the deformation amount increases, and a piezoelectric element using such piezoelectric thin film may be suitably used as an actuator of an ink jet recording head or the like (Japanese Patent No. 3890634).

Meanwhile, in recent years, further reduction in size and increase in performance have been required in devices, and along with this, a piezoelectric element has also been required to have improved performance. Under the above-mentioned circumstances, the usefulness of a lead zirconate titanate thin film having orientation controlled to the (110) plane is attracting attention.

In Japanese Patent No. 4516166, there is disclosed that a PZT thin film element oriented in the (100) plane cannot be displaced even through application of a voltage at a frequency of 14 kHz or more, but a PZT thin film element oriented in the (110) plane may be driven. In addition, in Japanese Patent No. 5828293, there is disclosed that a ferroelectric thin film made of PZT preferentially oriented in the (110) plane has a large dielectric constant. Further, in Advanced Materials Letters 2012, 3(2), 102-106, PZT thin film elements oriented in a (001) plane, the (110) plane, and the (111) plane, respectively, are compared to each other in terms of piezoelectric performance. It has been reported that, as a result of the comparison, the PZT thin film element oriented in the (110) plane has a piezoelectric constant after polarization treatment higher than that of the PZT thin film element oriented in the (001) plane. Thus, the preferential orientation of a PZT thin film in the (110) plane is given as one of the methods effective for further enhancing the performance of a piezoelectric element, but it is difficult to manufacture a PZT thin film preferentially oriented in the (110) plane as compared to those preferentially oriented in the other planes. As a method that has hitherto been used as a method of orienting a PZT thin film in the (110) plane, there is given a method involving successively forming layers through epitaxial growth from a (110) plane single crystal substrate of Si or magnesium oxide, to thereby provide a piezoelectric film oriented in the (110) plane, as disclosed in Japanese Patent No. 4516166. However, this method has a drawback in that an expensive (110) plane single crystal substrate is used, and it is necessary to select materials to be formed into films so as not to cause lattice mismatch between layers.

As another method, there is given a method involving interposing diamond-like carbon as a buffer layer that makes a piezoelectric layer side less liable to be influenced by a substrate portion, as disclosed in Japanese Patent No. 5509419. There is also given a method involving inserting a layer made of strontium titanate or barium titanate to manufacture a PZT thin film oriented in the (110) plane, as typified by Applied Physics Letters 96,031909 (2010) and "Preparation and Characterization of Orientation-controlled PZT Thin Films by Sol-gel Method", [online], Kunitaka Fujiyoshi and three others, Fukuoka Industrial Technology Center Research Report No. 15 (2005), Internet (URL: http://www.fitc.pref.fukuoka.jp/kenkyu/report/h16/h16-4.pdf). However, in the case of performing those methods, there may be a risk in that it is difficult to form a buffer layer to be introduced, and substances to be adopted may diffuse as impurities during heat treatment, resulting in decrease in performance of a piezoelectric material.

In order to prevent the above-mentioned situations, in Japanese Patent No. 5828293, there is a disclosure of a method of manufacturing a PZT thin film preferentially oriented in the (110) plane by introducing a layer formed of a PZT coating liquid decreased in concentration as an orientation control layer and controlling the thickness of the orientation control layer.

However, in the method disclosed in Japanese Patent No. 5828293, it is necessary to adjust the concentration of the coating liquid so that the orientation control layer has an intended thickness. Further, in order to suppress abnormal growth of a crystal, it is necessary to form a particle diameter control layer before forming the orientation control layer.

SUMMARY OF THE INVENTION

An object of the present invention is to provide a manufacturing method capable of more easily providing a dense piezoelectric thin film which is preferentially oriented in the (110) plane and in which the growth of a crystal grain is suppressed.

According to one embodiment of the present invention, there is provided a piezoelectric substrate, including:

a substrate including a $SiO_2$ layer as an outermost surface layer;

an intermediate layer made of one of Ti and $TiO_2$, which is formed on the $SiO_2$ layer of the substrate;

a lower electrode made of Pt, which is formed on the intermediate layer;

an orientation control layer containing lead titanate, which is formed on the lower electrode; and a piezoelectric layer, which is formed on the orientation control layer, the piezoelectric layer containing lead zirconate titanate having a composition represented by $Pb_x(Zr_{(y)}Ti_{(1-y)})O_3$, where x=1.0 to 1.2 and 0.4<y<0.6, the piezoelectric layer having a ratio of a reflection intensity of a (110) plane with respect to a total reflection intensity of a (100) plane, the (110) plane, and a (111) plane of 70% or more, which is measured by an X-ray diffraction method, and having an average particle diameter of crystal particles in a surface of 1.0 μm or less.

According to another embodiment of the present invention, there is provided a method of manufacturing a piezoelectric substrate, including: forming one of Ti and $TiO_2$ into a film as an intermediate layer on a $SiO_2$ layer of a substrate including the $SiO_2$ layer as an outermost surface layer; forming Pt into a film as a lower electrode on the intermediate layer at a substrate temperature within a range of from 10° C. to 50° C.; forming a first precursor layer by applying a first coating liquid containing a lead titanate precursor onto the lower electrode, followed by drying the first coating liquid; forming a second precursor layer by applying a second coating liquid containing a lead zirconate titanate precursor onto the first precursor layer, followed by drying the second coating liquid at a temperature within a range of from 330° C. to 360° C.; and collectively crystallizing the first precursor layer and the second precursor layer.

Further, the piezoelectric substrate of the present invention may also be used as constituent members of applications such as a sensor, a thin film capacitor, and an actuator each using a piezoelectric material.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

The inventors of the present invention have made extensive investigations of related-art piezoelectric thin films, and as a result, have found that it is possible to easily form a piezoelectric thin film which has a crystal surface preferentially oriented in the (110) plane and which contains lead zirconate titanate formed of a fine crystalline structure, to thereby achieve the present invention. A manufacturing process has the following two main features.

(1) A lower electrode made of Pt is formed on a substrate, which has Ti or a Ti oxide formed as an intermediate layer, at a temperature close to room temperature by a sputtering method without heating the substrate.

(2) A first coating liquid containing a lead titanate precursor is applied onto the lower electrode, followed by being dried, to thereby form a first precursor layer containing the lead titanate precursor. In this case, the drying temperature is adjusted. Further, a second coating liquid containing a lead zirconate titanate precursor is applied onto the first precursor layer without crystallizing the first precursor layer, followed by being dried, to thereby form a second precursor layer. In this case, the drying temperature is adjusted.

A first aspect of the present invention has a feature in that the lower electrode made of Pt to be formed into a film on the intermediate layer is formed into a film under a state in which the substrate is not heated, a lattice interval on the substrate is put into a state enlarged as compared to that of crystallized bulk Pt, and the lattice interval is shortened concurrently when both the precursor layers are dried and fired.

A second aspect of the present invention is based on the first aspect and has a feature in that, in the step of forming the first precursor layer, the first precursor layer is not fired so as not to be crystallized.

A third aspect of the present invention is based on the first aspect and has a feature in that, in the step of, after forming the first precursor layer, applying the second coating liquid onto the first precursor layer, followed by drying the second coating liquid, to thereby form the second precursor layer, the temperature for drying is set to fall within a range of from 330° C. to 360° C.

A fourth aspect of the present invention is based on the first and third aspects and has a feature in that the thickness of Ti or a Ti oxide to be introduced as the intermediate layer between the substrate and the lower electrode is set to 2 nm or more and 30 nm or less.

A fifth aspect of the present invention is based on the first and third aspects and has a feature in that, in the step of applying the first coating liquid onto the Pt formed as a lower electrode, followed by drying the first coating liquid, to thereby form the first precursor layer, the temperature for drying is set to fall within a range of from 150° C. to 360° C.

Based on the first, second, and third aspects of the present invention, a dense lead zirconate titanate piezoelectric thin film, which is preferentially oriented in the (110) plane and which has a particle diameter of 1.0 μm or less, can be formed easily and stably.

Based on the fourth aspect of the present invention, through setting of the thickness of the intermediate layer to the above-mentioned range, the crystallinity of the lower electrode and the piezoelectric thin film can be significantly improved while the adhesion between the lower electrode and the substrate is kept.

Based on the fifth aspect of the present invention, a piezoelectric thin film preferentially oriented in the (110) plane can be formed stably while a change in orientation and degradation in crystallinity caused by diffusion of the intermediate layer are suppressed.

The present invention is more specifically described below by way of embodiments, but the present invention is not limited to the following embodiments.

1. Piezoelectric Substrate

Figure 1:
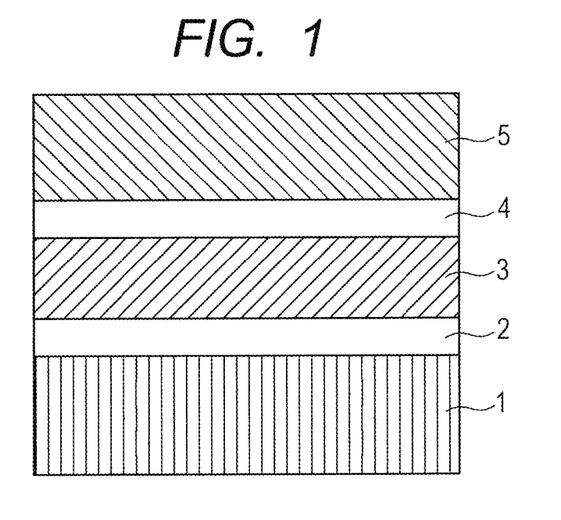
FIG. 1 is a schematic vertical sectional view for illustrating a piezoelectric substrate according to one embodiment.

FIG. 1 is a schematic vertical sectional view of a piezoelectric substrate according to one embodiment. In FIG. 1, there are illustrated an underlying substrate 1 configured to support a piezoelectric thin film, an intermediate layer 2, and an electrode (lower electrode) 3. Further, there are illustrated an orientation control layer 4, and a piezoelectric layer 5 formed on the orientation control layer 4. The orientation control layer 4 and the piezoelectric layer 5 are sometimes collectively referred to as "piezoelectric thin film".

It is preferred that a material for the substrate 1 contain $SiO_2$ at least in an outermost surface layer, and further the material not be liable to be deformed or melted even when receiving heat stress in a drying step after coating of the material. Further, it is preferred that the material have a smooth surface and can prevent the diffusion of elements during heat treatment, and also have sufficient mechanical strength. Further, when a liquid ejection head is manufactured through use of a piezoelectric thin film obtained in this embodiment, the underlying substrate 1 may also serve as a pressure chamber substrate configured to form a pressure chamber and a diaphragm of an actuator described later. For those purposes, for example, a semiconductor substrate made of silicon (Si) in which a surface layer is formed into a $SiO_2$ film by thermal oxidation may be preferably used, but ceramics, such as zirconia, alumina, and silica, may also be used. Further, as long as the outermost surface layer is made of $SiO_2$, a plurality of kinds of the above-mentioned materials may be combined, or those materials may be laminated to form a multi-layer structure.

The intermediate layer 2 is a layer configured to bring the $SiO_2$ layer in a lower portion into close contact with the electrode 3 in an upper portion. With only Pt, which is a metal, and $SiO_2$, which is an oxide, adhesiveness is weak, and in addition, the crystallinity of the electrode 3 and the piezoelectric layer 5 to be formed above the electrode 3 is degraded, with the result that satisfactory piezoelectric performance may not be obtained. Further, an excessive thickness of the intermediate layer 2 also causes a problem. When the thickness of the intermediate layer 2 is more than 30 nm, the crystallinity of the piezoelectric layer 5 serving as the upper layer is liable to be degraded. Therefore, it is preferred that the intermediate layer have a thickness of 2 nm or more and 30 nm or less. As a material for the intermediate layer 2, Ti or a Ti oxide typified by $TiO_2$ is preferred. The intermediate layer 2 may be a laminate of the Ti and the Ti oxide.

The electrode 3 is made of Pt and may be formed to have a thickness of from 5 nm to 2,000 nm. Further, as a method of forming the electrode 3, there are given several methods such as a sol-gel method, a sputtering method, and a vapor deposition method. However, from the viewpoint that the electrode 3 can be formed without increasing a temperature, it is preferred that the electrode 3 be formed by the sputtering method. There is no particular limitation on the thickness of the electrode 3 as long as conductivity can be obtained with the thickness, but it is preferred that the thickness be 10 nm or more and 1,000 nm or less. Further, the formed electrode 3 may be used after being patterned into a desired shape.

The orientation control layer 4 is a layer configured to control orientation of the piezoelectric layer 5 to be laminated thereon and is made of a perovskite oxide containing Pb and Ti, that is, lead titanate. The orientation control layer 4 has an effect of controlling a surface on which the piezoelectric layer 5 to be formed thereon is grown. Further, when a perovskite oxide containing Pb, Zr, and Ti is laminated as the piezoelectric layer 5, Pb diffuses from a precursor to the electrode 3 side due to heat stress in association with the heat treatment of crystallization. However, when the orientation control layer 4 is interposed, the orientation control layer 4 also exhibits an effect of suppressing the diffusion of Pb from the piezoelectric layer 5 side. In addition, Ti in the intermediate layer 2 between the lower electrode 3 and the substrate 1 also diffuses to the lower electrode 3 and the piezoelectric layer 5 due to heat stress. However, when the orientation control layer 4 is interposed, the orientation control layer 4 also exhibits an effect of suppressing the diffusion of Ti. It is preferred that the orientation control layer 4 have a thickness of 5 nm or more and 100 nm or less. When the thickness falls within this range, the effect of controlling the orientation of the piezoelectric layer 5 to the (110) plane and the effect of suppressing the diffusion of Pb and Ti are sufficiently obtained, with the result that the characteristics of the piezoelectric layer 5 are not adversely influenced.

It is preferred that a material for the piezoelectric layer 5 be a perovskite crystal represented by the general formula: $Pb_{(1.00\ to\ 1.20)}(Zr_xTi_{1-x})O_3$, where x is from 0.4 to 0.6, which is formed by the sol-gel method. When the composition of Zr and Ti falls within the above-mentioned range, a perovskite crystal having high piezoelectricity can be obtained.

The material for the piezoelectric layer 5 may be doped with a small amount of elements other than Pb, Zr, and Ti. Specific examples of elements that may be used as dopants for performing doping may include elements such as La, Ca, Sr, Ba, Sn, Th, Y, Sm, Ce, Bi, Sb, Nb, Ta, W, Mo, Cr, Co, Ni, Fe, Cu, Si, Ge, Sc, Mg, and Mn. It is only necessary that a compound containing those elements be added to a coating liquid during preparation thereof. It is preferred that the addition amount of the compound be from 0.1 mass % to 2 mass % of $Pb_{(1.00\ to\ 1.20)}(Zr_xTi_{1-x})O_3$, where x is from 0.4 to 0.6.

As a method of manufacturing the piezoelectric layer, a sputtering method, a metal organic chemical vapor deposition (MOCVD) method, a sol-gel method, and the like have been known. In the present invention, the sol-gel method or a method similar thereto is used.

In the sol-gel method, first, a coating liquid containing a hydrolysable compound of each component metal serving as a raw material, a partially hydrolysable compound thereof, or a partially polycondensable compound thereof (those compounds are collectively referred to as "precursor") is applied onto a substrate, and the coating liquid is dried. After that, the coating liquid is heated in air and further fired to be crystallized at a temperature equal to or more than a crystallization temperature thereof, to thereby form a piezoelectric thin film. The sol-gel method enables a piezoelectric thin film to be formed most simply at lowest cost.

As the method similar to the sol-gel method, there is given a metal organic decomposition (MOD) method. In the MOD method, a coating liquid containing, as a piezoelectric thin film precursor, a thermally-decomposable organic metal compound (metal complex and metal organic acid salt), for example, a β-diketone complex or a carboxylate of a metal is applied onto a substrate. Then, the coating liquid is heated in, for example, air or oxygen to cause evaporation of the solvent in the coating liquid and pyrolysis of the organic metal compound. Further, the resultant is fired to be crystallized at a temperature equal to or more than a crystallization temperature thereof, to thereby form a piezoelectric thin film.

In this specification, the above-mentioned sol-gel method and MOD method, and a combination thereof are collectively referred to as "sol-gel method".

In the present invention, a piezoelectric layer containing lead zirconate titanate having a composition represented by $Pb_x(Zr_{(y)} Ti_{(1-y)})O_3$, where x=1.0 to 1.2 and 0.4<y<0.6, having a ratio of the reflection intensity of a (110) plane with respect to the total reflection intensity of a (100) plane, the (110) plane, and a (111) plane of 70% or more, which is measured by an X-ray diffraction method, and having an average particle diameter of crystal particles in a surface of 1.0 μm or less can be obtained by a manufacturing method described later.

2. Liquid Ejection Head

Figure 2:
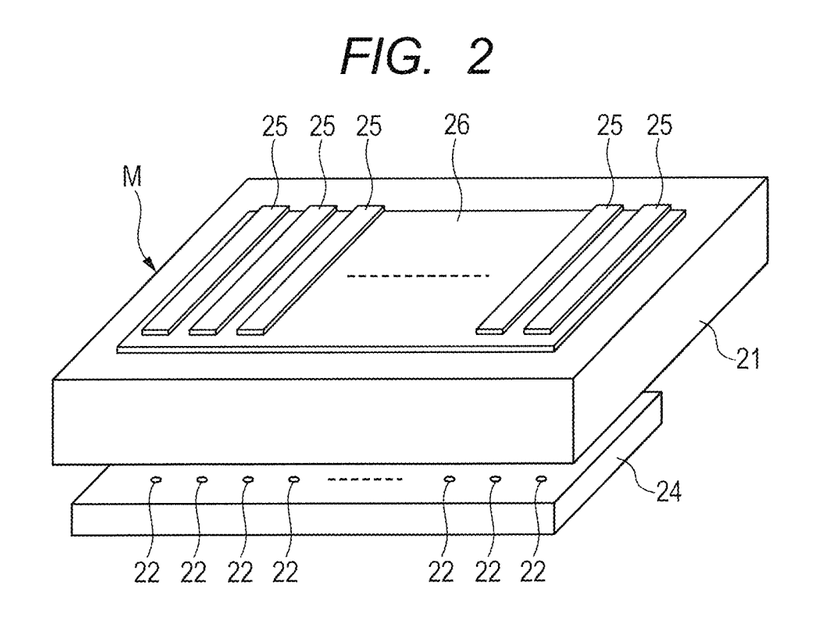
FIG. 2 is a schematic perspective view for illustrating a liquid ejection head according to one embodiment.
Figure 3:
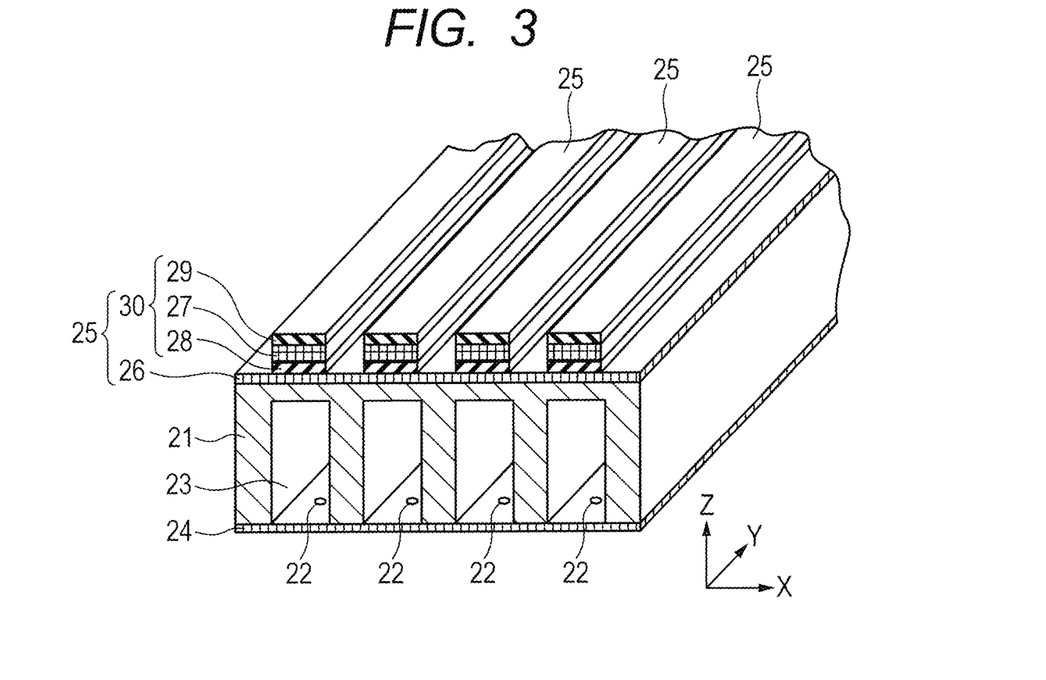
FIG. 3 is a schematic perspective sectional view for illustrating the liquid ejection head according to one embodiment.
Figure 4:
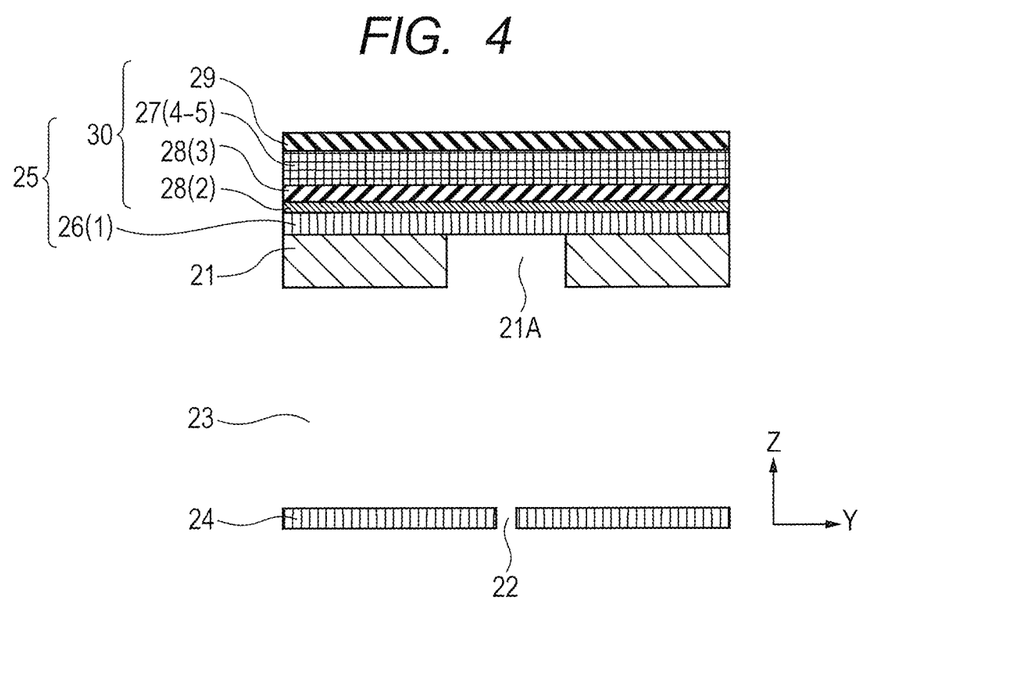
FIG. 4 is a schematic sectional view for illustrating the liquid ejection head according to one embodiment.

FIG. 2 to FIG. 4 are each a view for illustrating a liquid ejection head according to one embodiment, which includes the piezoelectric substrate obtained as described above. The liquid ejection head includes a liquid ejection head substrate 21, liquid ejection orifices 22 configured to eject a liquid, for example, a plurality of inks, a plurality of pressure chambers 23, and actuators 25 arranged so as to correspond to the pressure chambers 23, respectively. The pressure chambers 23 are arranged so as to correspond to the liquid ejection orifices 22, respectively, and communicate to the liquid ejection orifices 22. The actuator 25 causes a change in volume of a liquid in the pressure chamber 23 through vibration of the actuator 25, to thereby eject the liquid through the liquid ejection orifice 22. The liquid ejection orifices 22 are formed at predetermined intervals on a nozzle plate 24, and the pressure chambers 23 are arranged in parallel so as to correspond to the liquid ejection orifices 22 on the liquid ejection head substrate 21. In this embodiment, the liquid ejection orifices 22 are formed on a lower surface side of the actuators 25, but the liquid ejection orifices 22 may also be formed on a side surface side of the actuators 25. On an upper surface of the liquid ejection head substrate 21, openings 21A corresponding to the pressure chambers 23, respectively, are formed, and each of the actuators 25 is arranged so as to close the opening 21A. Each of the actuators 25 includes a diaphragm 26 and a piezoelectric element 30 in the stated order from the pressure chamber 23 side, and the piezoelectric element 30 includes a piezoelectric thin film 27 and a pair of electrodes (lower electrode 28 and upper electrode 29).

There is no particular limitation on a material for the diaphragm 26, but a semiconductor, for example, Si, a metal, a metal oxide, glass, and the like are preferred. The piezoelectric element 30 and the diaphragm 26 may be formed through joining or adhesion, or the piezoelectric element 30 may be formed directly on the diaphragm 26 serving as a substrate. Further, the piezoelectric element 30 may be formed directly on the liquid ejection head substrate 21.

3. Manufacturing Process of Piezoelectric Substrate

Next, a method of manufacturing a piezoelectric substrate in the present invention is described.

First, a substrate including a $SiO_2$ layer as an outermost surface layer is prepared. When, for example, a Si substrate is used as the substrate, the surface of the Si substrate may be subjected to thermal oxidation to form a $SiO_2$ layer. Then, Ti or $TiO_2$ is formed into a film as an intermediate layer on the $SiO_2$ layer. There is no particular limitation on a method of forming the intermediate layer, but a sputtering method capable of forming a film at relatively low temperature is preferred.

Subsequently, Pt is formed into a film as a lower electrode on the intermediate layer. Pt is formed into a film at a substrate temperature within a range of from 10° C. to 50° C. Also in this case, the sputtering method capable of forming a film at relatively low temperature is preferred. Thus, the Pt film formed at low temperature has a (111) orientation, but the peak position thereof is shifted to a lower angle side by 0.1° or more than crystallized Pt(111), which is measured by an X-ray diffraction method. That is, the Pt film is formed under a state in which a lattice interval is larger than that of the crystallized Pt(111).

A piezoelectric thin film containing lead titanate (PTO) serving as an orientation control layer and lead zirconate titanate (PZT) serving as a piezoelectric layer is formed by a sol-gel method on the substrate on which the layers up to the lower electrode have been formed as described above.

A method of forming the piezoelectric thin film is as described below.

A manufacturing process of the piezoelectric thin film is classified into the following steps (1) to (6).

(1) A production (preparation) step of a coating liquid for forming an orientation control layer (hereinafter referred to as "first coating liquid") and a coating liquid for forming a piezoelectric layer (hereinafter referred to as "second coating liquid").

(2) A coating step of applying the first coating liquid onto the substrate.

(3) A drying step of volatilizing a solvent in the first coating liquid applied onto the substrate, to thereby form a precursor layer (hereinafter referred to as "first precursor layer") of the orientation control layer.

(4) A coating step of applying the second coating liquid onto the first precursor layer.

(5) A drying step of volatilizing a solvent in the second coating liquid applied onto the first precursor layer, to thereby form a precursor layer (hereinafter referred to as "second precursor layer") of the piezoelectric layer.

(6) A firing step of collectively crystallizing the first and second precursor layers on the substrate.

(1) Production Process of Coating Liquids

In a production process of coating liquids, a coating liquid containing an organic solvent and a PTO precursor and a coating liquid containing an organic solvent and a PZT precursor, which are to be applied onto the substrate, are produced, respectively. Examples of the precursors of PTO and PZT may include a hydrolysable compound of each component metal, a partially hydrolysable compound thereof, a partially polycondensable compound thereof, a thermally-decomposable compound, and raw materials for those compounds. As the raw materials for generating those compounds, there may be given an organic metal compound. Typical examples thereof include metal alkoxides, organic acid salts, and metal complexes, for example, a β-diketone complex, of the metal. As the metal complexes, various other complexes, such as an amine complex, may be utilized. Examples of a β-diketone for forming the β-diketone complex may include acetylacetone (=2,4-pentanedione), heptafluorobutanoylpivaloylmethane, dipivaloylmethane, trifluoroacetylacetone, and benzoylacetone.

Specific examples of the organic metal compound suitable as the raw material may include, as a lead compound and a lanthanum compound, organic acid salts, such as acetates (lead acetate and lanthanum acetate), and organic metal alkoxides, such as diisopropoxy lead. As a titanium compound, organic metal alkoxides, such as tetraethoxy titanium, tetraisopropoxy titanium, tetra-n-butoxy titanium, tetraisobutoxy titanium, tetra-tert-butoxy titanium, and dimethoxy diisopropoxy titanium are preferred, and organic acid salts or organic metal complexes may also be used. The same description as that of the above-mentioned titanium compound applies to a zirconium compound. Regarding the other metal compounds, the same compounds as those described above may be used, but the other metal compounds are not limited thereto. Further, the above-mentioned metal compounds may be used in combination thereof. The organic metal compound may be a composite organic metal compound containing two or more kinds of component metals instead of the above-mentioned compound containing one kind of metal.

As the first and second coating liquids, the above-mentioned organic metal compound is dissolved or dispersed in an appropriate organic solvent, to thereby prepare a coating liquid containing, for example, a composite organic metal oxide (oxide containing two or more metals) serving as a PTO precursor or a PZT precursor. As the first coating liquid, a coating liquid containing Pb and Ti is prepared. As the second coating liquid, a coating liquid containing Pb, Zr, and Ti is prepared.

Further, the organic solvent to be used for preparation of the coating liquid is appropriately selected from known various solvents in consideration of dispersibility and applicability. Examples of the organic solvent to be used for preparation of the coating liquid may include: alcohol-based solvents, such as methanol, ethanol, n-butanol, n-propanol, and isopropanol; ether-based solvents, such as tetrahydrofuran and 1,4-dioxane; cellosolve-based solvents, such as methyl cellosolve and ethyl cellosolve; amide-based solvents, such as N,N-dimethylformamide, N,N-dimethylacetamide, and N-methylpyrrolidone-based solvents; and nitrile-based solvents, such as acetonitrile. Of those, alcohol-based solvents are preferably used.

There is no particular limitation on the amount of the organic solvent in the coating liquid. However, in the case of the first coating liquid, it is preferred that the amount of the organic solvent be adjusted so that a metal solid content concentration reaches 1.0 mass % or more and 2.0 mass % or less. In the case of the second coating liquid, it is preferred that the amount of the organic solvent be adjusted so that a metal solid content concentration reaches 15 mass % or more and 30 mass % or less. When the amount of the organic solvent in the coating liquid falls within those ranges, it becomes easy to set the final thickness of the piezoelectric thin film to 150 nm or more and 400 nm or less.

It is appropriate that the ratio of each organic metal compound in the coating liquid in the case of using a plurality of organic metal compounds be set to substantially the same ratio as the composition ratio of a material for the orientation control layer or the piezoelectric layer to be manufactured. In the case of, for example, the piezoelectric layer, the ratio of each organic metal compound may be set to substantially the same ratio as the composition ratio of $Pb_{(1.00\ to\ 1.20)}(Zr_xTi_{1-x})O_3$, where x is from 0.4 to 0.6. When the piezoelectric thin film represented by $Pb_{(1.00\ to\ 1.20)}(Zr_xTi_{1-x})O_3$, where x is from 0.4 to 0.6, is formed, a lead compound generally has high volatility, and hence deficiency of lead due to evaporation may occur during a heat treatment step described later. Therefore, lead may be incorporated slightly excessively, for example, in an excessive amount of 2 mol % or more and 40 mol % or less with respect to the required amount of lead in terms of a stoichiometric proportion in expectation of the deficiency. The degree of deficiency of lead varies depending on the kind of a lead compound and the film formation condition and may be determined through an experiment.

In the first and second coating liquids, 1,8-diazabicyclo[5.4.0]-7-undecene (hereinafter sometimes referred to as "DBU"), 1,5-diazabicyclo[4.3.0]non-5-ene (hereinafter sometimes referred to as "DBN"), or 1,4-diazabicyclo[2.2.2]octane (hereinafter sometimes referred to as "DABCO") may be added as a stabilizer. Further, as other stabilizers, β-diketones (for example, acetylacetone, heptafluorobutanoylpivaloylmethane, dipivaloylmethane, trifluoroacetylacetone, and benzoylacetone), ketone acids (for example, acetoacetic acid, propionylacetic acid, and benzoylacetic acid), lower alkyl (for example, ethyl, propyl, and butyl) esters of the ketone acids, oxyacids (for example, lactic acid, glycolic acid, α-oxybutyric acid, and salicylic acid), lower alkyl esters of the oxyacids, oxyketones (for example, diacetone alcohol and acetoin), α-amino acids (for example, glycin and alanine), or alkanolamines (for example, diethanolamine, triethanolamine, and monoethanolamine), which have heretofore been used, may be used in combination thereof.

The amount of the stabilizer in the first and second coating liquids is preferably 0.05-fold mol or more and 5-fold mol or less, more preferably 0.1-fold mol or more and 1.5-fold mol or less with respect to the total molar number of metal atoms.

(2) Coating Step of First Coating Liquid

In a coating step of a first coating liquid, a first coating liquid containing an organic solvent and an orientation control layer precursor is applied onto a substrate. Thus, a layer containing the organic solvent and the orientation control layer precursor is formed on the substrate. As a coating method for the first coating liquid, a known coating method, such as spin coating, dip coating, bar coating, or spray coating, may be used. Further, when the coating liquid is applied onto the substrate, it is preferred that a surface of the substrate onto which the coating liquid is applied be arranged in a horizontal direction (direction orthogonal to a vertical direction). With this, a layer having a uniform thickness and distribution of an orientation control layer precursor can be obtained. The first coating liquid may be applied once or a plurality of times.

There is no particular limitation on the thickness of a first precursor layer obtained by applying the first coating liquid once, but it is preferred that the thickness of the first precursor layer be determined so that an orientation control layer finally obtained by firing is 5 nm or more and 100 nm or less.

The thickness of the first precursor layer may be controlled by changing the concentration of the orientation control layer precursor in the first coating liquid and the coating condition of the first coating liquid, and this condition may be determined through an experiment. For example, the first coating liquid having a solid content concentration of 1.0 mass % or more and 2.0 mass % or less is applied by a spin coating method at 2,000 rpm, and the coating liquid is dried, to thereby form a first precursor layer.

(3) Drying Step of First Coating Liquid

In a drying step of the first coating liquid, the organic solvent is evaporated from the applied first coating liquid in a calm environment to provide the first precursor layer. This step is performed at a temperature of 150° C. or more and 360° C. or less. A piezoelectric thin film preferentially oriented in the (110) plane may be manufactured by setting the temperature for drying the first coating liquid to fall within the above-mentioned range. When the drying temperature is set to be less than this range, the evaporation of the organic solvent does not sufficiently proceed, and components of the organic solvent remain in the first precursor layer, with the result that there is concern that the piezoelectric layer may be adversely influenced. Further, when the drying temperature is set to be higher than this range, Ti adopted as the intermediate layer is precipitated onto a Pt surface of the lower electrode to influence the first precursor layer, to thereby grow a piezoelectric thin film on the (111) plane. There is no particular limitation on the time period for performing the drying treatment, but it is desired that the time period be 5 minutes or more and less than 60 minutes.

This drying step may be performed by loading the substrate into a heat source, for example, a dryer, a hot plate, a tubular furnace, or an electric furnace, or bringing the substrate into direct contact therewith. Of those, from the viewpoint of uniformity of a heating temperature, a hot plate configured to heat the substrate from a back surface thereof is preferred. In this case, the preset temperature and actual temperature of the hot plate may vary by about ±10° C. depending on the setting environment.

The drying step is performed so that the surface (coating surface) of the substrate onto which the coating liquid has been applied is put in the calm environment. Specifically, an air inlet configured to suck warm air and hot air or an air outlet configured to discharge air with respect to the coating surface are not arranged. Further, when the air inlet and the air outlet are arranged, a flow of the organic solvent and the hot air is prevented from occurring on the substrate. With this, the air has a flow velocity of 0.05 m/s or less at a position of 20 cm above the surface of the substrate onto which the coating liquid has been applied.

(4) Coating Step of Second Coating Liquid

In a coating step of a second coating liquid, a second coating liquid containing an organic solvent and the PZT precursor is applied onto the first precursor layer formed in the previous step. Thus, a second precursor layer containing the organic solvent and the PZT precursor is formed on the first precursor layer. As a coating method for the coating liquid, a known coating method, such as spin coating, dip coating, bar coating, or spray coating, may be used. Further, when the second coating liquid is applied onto the substrate, it is preferred that a surface of the substrate onto which the coating liquid is applied be arranged in a horizontal direction (direction orthogonal to a vertical direction). With this, a layer having a uniform thickness and distribution of a piezoelectric thin film precursor can be obtained. The second coating liquid may be applied once or a plurality of times.

There is no particular limitation on the thickness of a second precursor layer obtained by applying the second coating liquid once, but it is only necessary that the thickness of the second precursor layer be determined so that the thickness per layer of a piezoelectric thin film finally obtained by firing is 150 nm or more and 400 nm or less, and the thickness of the piezoelectric thin films at the time of lamination is 300 nm or more and 4 µm or less.

The coating thickness may be controlled by changing the concentration of the PZT precursor in the second coating liquid and the coating condition of the second coating liquid, and this condition may be determined through an experiment. For example, the second coating liquid having a solid content concentration of 20 mass % or more and 25 mass % or less is applied by a spin coating method at 2,000 rpm, and the second coating liquid is dried. With this, a second precursor layer corresponding to a piezoelectric layer having a thickness of 200 nm or more and 330 nm or less may be formed by applying the second coating liquid once.

(5) Drying Step of Second Coating Liquid

In a drying step of the second coating liquid, the organic solvent is evaporated from the applied second coating liquid in a calm environment to provide the second precursor layer. This step is performed at a temperature of 330° C. or more and 360° C. or less. A piezoelectric thin film preferentially oriented in the (110) plane may be manufactured by setting the temperature for drying the second coating liquid to fall within the above-mentioned range. When the drying temperature is set to be less than 330° C., although a detailed mechanism is not clear, the piezoelectric layer after firing treatment is not grown on the (110) plane, with the result that the piezoelectric layer is preferentially oriented in the (111) plane and the (100) plane or each plane is mixed. Further, when the drying temperature is set to be higher than 360° C., as in the first precursor layer, Ti adopted as the intermediate layer is precipitated onto a Pt surface of the lower electrode to influence the first precursor layer, to thereby grow a piezoelectric thin film on the (111) plane. There is no particular limitation on the time period for performing the drying treatment, but it is preferred that the time period be 5 minutes or more and 60 minutes or less.

This drying step may be performed by loading the substrate into a heat source, for example, a dryer, a hot plate, a tubular furnace, or an electric furnace, or bringing the substrate into direct contact therewith. Of those, from the viewpoint of uniformity of a heating temperature, a hot plate configured to heat the substrate from a back surface thereof is preferred.

The drying step is performed so that the surface (coating surface) of the substrate onto which the coating liquid has been applied is put in the calm environment. Specifically, an air inlet configured to suck warm air and hot air or an air outlet configured to discharge air with respect to the coating surface are not arranged. Further, when the air inlet and the air outlet are arranged, a flow of the organic solvent and the hot air is prevented from occurring on the substrate. With this, the air has a flow velocity of 0.05 m/s or less at a position of 20 cm above the surface of the substrate onto which the coating liquid has been applied.

(6) Firing Step of First and Second Precursor Layers

After the formation of the second precursor layer, the first and second precursor layers are collectively heated by firing treatment, to thereby form a piezoelectric thin film. The piezoelectric thin film includes the orientation control layer 4 made of PTO and the piezoelectric layer 5 made of PZT. Further, the orientation control layer 4 and the piezoelectric layer 5 may be mixed at an interface therebetween or a composition may gradually change from lead titanate to lead zirconate titanate at the interface. In this case, when only the first precursor layer is fired before the second precursor layer is formed, a piezoelectric thin film obtained by applying and firing the second coating liquid is not grown on the (110) plane and is preferentially grown on the planes other than the (110) plane.

This firing step may be performed by loading the substrate into a heat source, for example, a dryer, a hot plate, a tubular furnace, or an electric furnace, or bringing the substrate into direct contact therewith. In this case, it is preferred that the heating be performed at 500° C. or more and 800° C. or less. Further, it is only necessary that a heating atmosphere be an oxidizing atmosphere, and the heating may be performed in an air atmosphere, an atmosphere containing more than 20% of oxygen, or the like. There is no particular limitation on the time period of heating, but it is desired that the time period be 2 minutes or more and less than 60 minutes. The heating step of both the precursor layers may be separately performed a plurality of times or may be performed only once.

4. Apparatus for Manufacturing Piezoelectric Thin Film

An apparatus for manufacturing a piezoelectric thin film includes a coating unit, a drying unit, and a heating unit. The coating unit is capable of applying the first or second coating liquid containing the organic solvent and the PTO precursor or the PZT precursor onto the substrate. The substrate is to be placed in a placement portion. The drying unit is capable of evaporating the organic solvent from each of the coating liquids applied in the calm environment, to thereby provide the first precursor layer or the second precursor layer. The heating unit is capable of heating both the precursor layers to form the piezoelectric thin film from both the precursor layers.

Now, the present invention is specifically described by way of Examples. An orientation degree and an average particle diameter in Examples and Comparative Examples were evaluated by the following methods.

(Orientation Degree Evaluation Method)

The obtained piezoelectric thin film was measured by an X-ray diffraction apparatus (XRD; RINT-2100 manufactured by Rigaku Corporation), and an orientation plane having the highest intensity among the obtained diffraction results was defined as a preferential orientation plane of the piezoelectric thin film. An orientation degree of the (110) plane of the piezoelectric thin film was determined by calculating "Intensity of (110) plane/(Intensity of (100) plane+Intensity of (110) plane+Intensity of (111) plane)" based on the above-mentioned diffraction results. A measurement condition is described below.

(Measurement Conditions)

X-ray source: Cu Kα
X-ray output: 40 kV/10 mA
X-ray slit width incidence: 0.47 mm, reflection: 0.3 mm
Measurement conditions: θ-2θ
Measurement range: 2θ: 20° to 45°
Measurement step width: 0.03°
Measurement time: 1.0 s/step (Average Particle Diameter Measurement Method)

An average particle diameter of each piezoelectric thin film was determined by using electron micrographs of a piezoelectric thin film surface photographed with a magnification of 50,000 times and 100,000 times through use of a scanning electron microscope (SEM; FE-SEM S-4800 manufactured by Hitachi High-Technologies Corporation) and measuring the longest diameter and the shortest diameter of any thirty crystal particles coming out in the electron micrographs with a scale with the naked eye, and an average value thereof was defined as an average particle diameter of the piezoelectric thin film.

Example 1

As a first coating liquid of a piezoelectric thin film, a coating liquid containing a lead titanate (PTO) precursor having a metal composition represented by Pb/Ti=1.15/1.00 was prepared as described below.

1.2 mol of a lead acetate hydrate was dehydrated by heating, and the resultant was mixed with 1.2 mol of 1,8-diazabicyclo[5.4.0]-7-undecene and 1-methoxy-2-propanol (9 mol) as stabilizers. The mixture was caused to react by heating and stirring. Then, 1 mol of tetraisopropoxy titanium was added to the resultant, and the mixture was further caused to react by heating, to thereby composite metal compounds with each other. Next, water (5 mol) and ethanol (5.0 mol) were added to the resultant, and the resultant was subjected to a hydrolysis reaction, to thereby provide a PTO precursor. In this case, acetic acid (3.8 mol) and acetylacetone (0.6 mol) were added. After that, a solvent having a boiling point of 100° C. or less was completely removed with a rotary evaporator, and diethylene glycol monoethyl ether (organic solvent) was added to the resultant to regulate the concentration so that the concentration converted into PTO having the above-mentioned metal composition ratio was 1.1 mass %, to thereby prepare the first coating liquid.

Next, as a second coating liquid, a coating liquid containing a lead zirconate titanate (PZT) precursor having a metal composition represented by Pb/Zr/Ti=1.2/0.52/0.48 was prepared as described below.

1.2 mol of a lead acetate hydrate was dehydrated by heating, and the resultant was mixed with 1.2 mol of 1,8-diazabicyclo[5.4.0]-7-undecene and 1-methoxy-2-propanol (9 mol) as stabilizers. The mixture was caused to react by heating and stirring. Then, 0.52 mol of tetra-n-butoxy zirconium and 0.48 mol of tetraisopropoxy titanium were added to the resultant, and the mixture was further caused to react by heating, to thereby composite raw material metal compounds with each other. Next, water (5 mol) and ethanol (5.0 mol) were added to the resultant, and the resultant was subjected to a hydrolysis reaction. In this case, acetic acid (3.8 mol) and acetylacetone (0.6 mol) were added. After that, a solvent having a boiling point of 100° C. or less was completely removed with a rotary evaporator, and diethylene glycol monoethyl ether was added to the resultant to regulate the concentration so that the concentration converted into PZT having the above-mentioned metal composition ratio was 24 mass %, to thereby prepare the second coating liquid.

Then, as a substrate to be used in this Example, a substrate, in which a silica ($SiO_2$) layer was formed to have a thickness of 500 nm by thermal oxidation on a surface of a silicon substrate having a diameter of 6 inches (15 cm), was prepared. Ti was formed into a film having a thickness of 10 nm on the substrate by a sputtering method under a state in which the substrate was not heated, to thereby form an intermediate layer. Then, Pt was formed into a film having a thickness of 150 nm on the intermediate layer of Ti by the sputtering method under a state in which the substrate was not heated, to thereby form a lower electrode.

Next, the first coating liquid was applied onto the Pt surface of the substrate formed in the previous step with a spin coater (for 15 seconds at 2,000 rpm). Next, as a step of removing the organic solvent contained in the first coating liquid on the substrate out of the system, the coated substrate was placed on a hot plate (trade name "Shamal hot plate HHP-411", temperature unevenness of a board surface: 150° C.±1° C., manufactured by AS ONE Corporation) which was heated to 150° C., for 5 minutes, and the organic solvent in the first coating liquid was evaporated, to thereby form a first precursor layer containing a PTO precursor.

After that, the above-mentioned prepared second coating liquid was rapidly applied onto the first precursor layer with a spin coater (for 15 seconds at 4,000 rpm). Then, as a step of removing the organic solvent in the applied second coating liquid out of the system, the coated substrate was placed on the above-mentioned hot plate (temperature unevenness of a board surface: 340° C.±1° C.) which was heated to 340° C., for 5 minutes, and the organic solvent was evaporated, to thereby form a second precursor layer containing a PZT precursor. The substrate having both the precursor layers formed thereon was subjected to firing (rapid thermal annealing, which is also called "RTA") at 650° C. for 10 minutes in an oxygen atmosphere at a temperature increase rate of 70° C./sec in an electric furnace to crystallize both the precursors, to thereby provide a piezoelectric thin film including an orientation control layer and a piezoelectric layer. The piezoelectric thin film thus obtained was defined as a piezoelectric thin film of Example 1.

Example 2

A piezoelectric thin film was obtained by the same procedure as that of Example 1 except that the temperature of the hot plate, at a time when the first coating liquid was applied and dried to form the first precursor layer, was set to 340° C. The piezoelectric thin film thus obtained was defined as a piezoelectric thin film of Example 2.

Example 3

A piezoelectric thin film was obtained by the same procedure as that of Example 1 except that the temperature of the hot plate, at a time when the first coating liquid was applied and dried to form the first precursor layer, was set to 360° C., and the drying temperature of the hot plate, at a time when the second coating liquid was applied and dried to form the second precursor layer, was set to 340° C. The piezoelectric thin film thus obtained was defined as a piezoelectric thin film of Example 3.

Example 4

A piezoelectric thin film was obtained by the same procedure as that of Example 1 except that the temperature of the hot plate, at a time when the first coating liquid was applied and dried to form the first precursor layer, was set to 280° C., and the drying temperature of the hot plate, at a time when the second coating liquid was applied and dried to form the second precursor layer, was set to 360° C. The piezoelectric thin film thus obtained was defined as a piezoelectric thin film of Example 4.

Example 5

A piezoelectric thin film was obtained by the same procedure as that of Example 1 except that the temperature of the hot plate, at a time when the first coating liquid was applied and dried to form the first precursor layer, was set to 200° C., and the drying temperature of the hot plate, at a time when the second coating liquid was applied and dried to form the second precursor layer, was set to 340° C. The piezoelectric thin film thus obtained was defined as a piezoelectric thin film of Example 5.

Example 6

A piezoelectric thin film was obtained by the same procedure as that of Example 1 except that the temperature of the hot plate, at a time when the first coating liquid was applied and dried to form the first precursor layer, was set to 280° C., and the drying temperature of the hot plate, at a time when the second coating liquid was applied and dried to form the second precursor layer, was set to 340° C. The piezoelectric thin film thus obtained was defined as a piezoelectric thin film of Example 6.

Example 7

A piezoelectric thin film was obtained by the same procedure as that of Example 1 except that the temperature of the hot plate, at a time when the first coating liquid was applied and dried to form the first precursor layer, was set to 150° C., and the drying temperature of the hot plate, at a time when the second coating liquid was applied and dried to form the second precursor layer, was set to 330° C. The piezoelectric thin film thus obtained was defined as a piezoelectric thin film of Example 7.

Example 8

A piezoelectric thin film was obtained by the same procedure as that of Example 1 except that the temperature of the hot plate and the drying time, at a time when the first coating liquid was applied and dried to form the first precursor layer, were set to 150° C. and 30 minutes, respectively, and the drying temperature of the hot plate, at a time when the second coating liquid was applied and dried to form the second precursor layer, was set to 330° C. The piezoelectric thin film thus obtained was defined as a piezoelectric thin film of Example 8.

Example 9

A piezoelectric thin film was obtained by the same procedure as that of Example 1 except that the temperature of the hot plate, at a time when the first coating liquid was applied and dried to form the first precursor layer, was set to 150° C., and the drying temperature of the hot plate and the drying time, at a time when the second coating liquid was applied and dried to form the second precursor layer, were set to 330° C. and 30 minutes, respectively. The piezoelectric thin film thus obtained was defined as a piezoelectric thin film of Example 9.

Comparative Example 1

A piezoelectric thin film made of PZT was obtained by the same procedure as that of Example 1 except that the second coating liquid was directly applied onto the Pt surface of the substrate in the same manner as in Example 1 without forming the first precursor layer, followed by being dried and fired. The piezoelectric thin film thus obtained was defined as a piezoelectric thin film of Comparative Example 1.

Comparative Example 2

A piezoelectric thin film made of PZT was obtained by the same procedure as that of Example 1 except that, after the first precursor layer was formed on the substrate, the first precursor layer was subjected to firing (RTA) at 650° C. for 10 minutes in an oxygen atmosphere at a temperature increase rate of 70° C./sec in the electric furnace, and the second coating liquid was applied after the orientation control layer made of lead titanate was crystallized. The piezoelectric thin film thus obtained was defined as a piezoelectric thin film of Comparative Example 2.

Comparative Example 3

A piezoelectric thin film was obtained by the same procedure as that of Example 1 except that the drying temperature of the hot plate, at a time when the second coating liquid was applied and dried to form the second precursor layer, was set to 280° C. The piezoelectric thin film thus obtained was defined as a piezoelectric thin film of Comparative Example 3.

Comparative Example 4

A piezoelectric thin film was obtained by the same procedure as that of Example 2 except that the drying temperature of the hot plate, at a time when the second coating liquid was applied and dried to form the second precursor layer, was set to 380° C. The piezoelectric thin film thus obtained was defined as a piezoelectric thin film of Comparative Example 4.

Comparative Example 5

A piezoelectric thin film was obtained by the same procedure as that of Example 1 except that, after the Pt was formed into a film as the lower electrode, the Pt was heated at 400° C. for 5 minutes with the hot plate to be crystallized, and then the piezoelectric thin film was formed. The piezoelectric thin film thus obtained was defined as a piezoelectric thin film of Comparative Example 5.

380° C. The piezoelectric thin film thus obtained was defined as a piezoelectric thin film of Comparative Example 6.

(Comparative Test)

Figure 5:
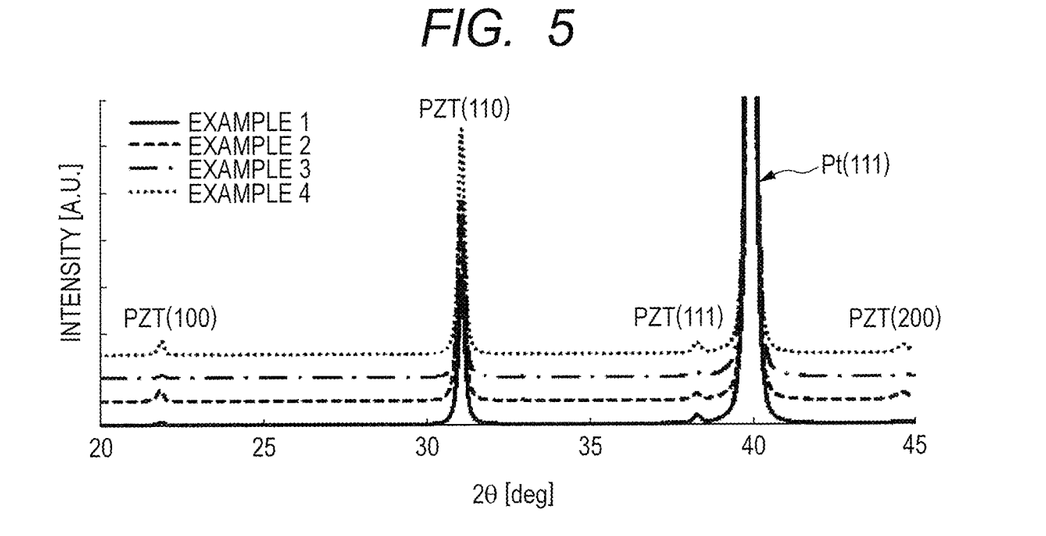
FIG. 5 is a graph for showing X-ray diffraction results of piezoelectric thin films of Examples 1 to 4.
Figure 6:
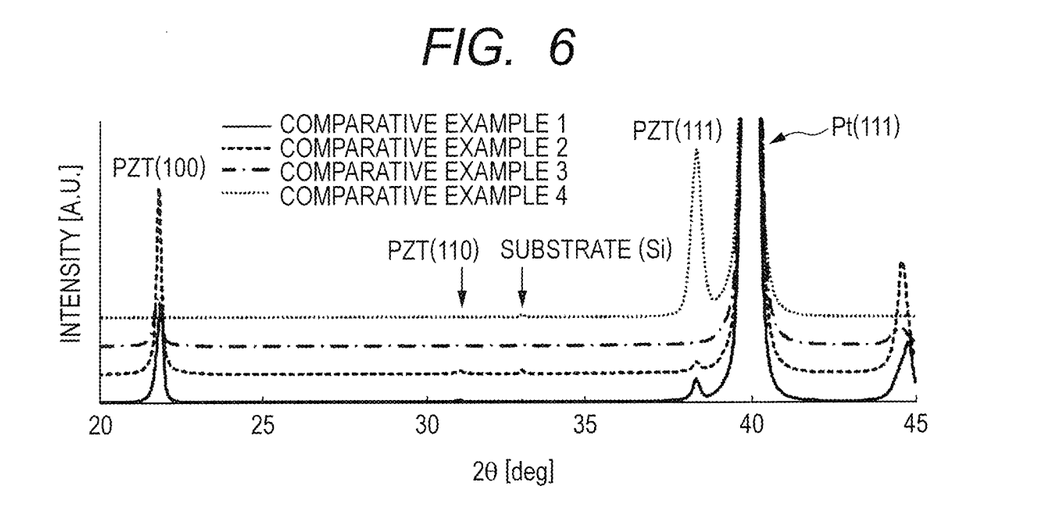
FIG. 6 is a graph for showing X-ray diffraction results of piezoelectric thin films of Comparative Examples 1 to 4.
Figure 7:
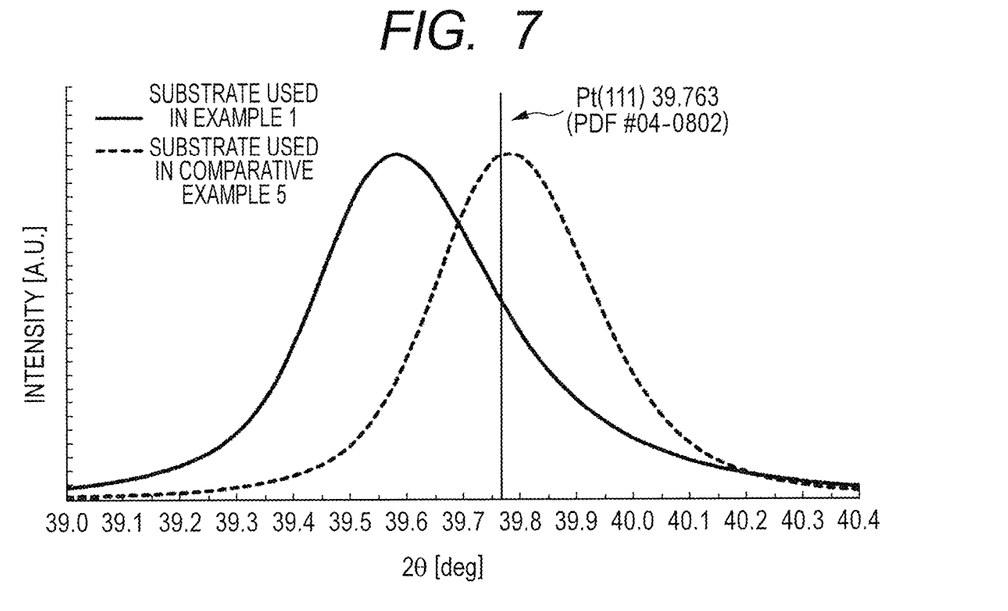
FIG. 7 is a graph for showing X-ray diffraction results of substrates each having a Pt electrode formed thereon used in Example 1 and Comparative Example 5.
Figure 8:
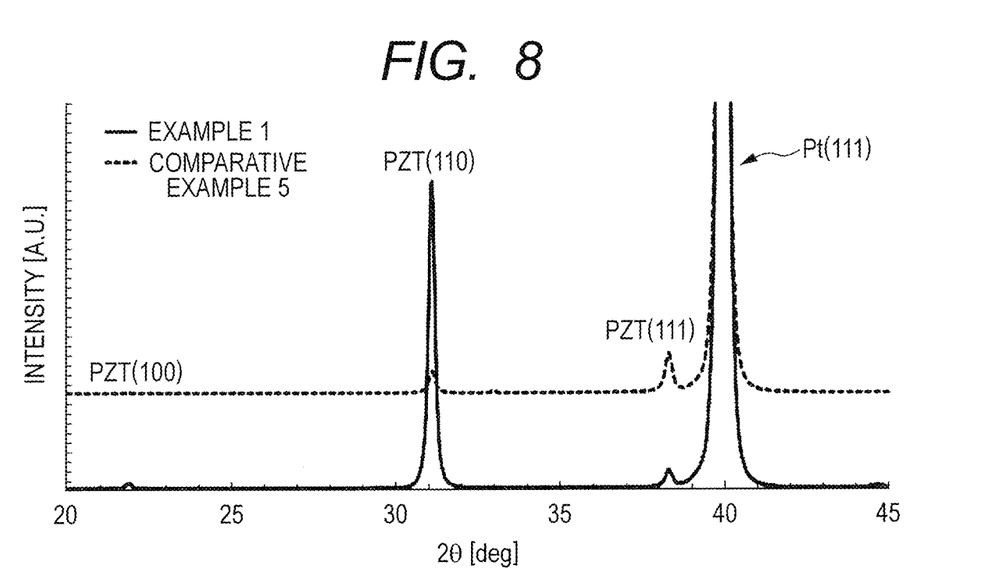
FIG. 8 is a graph for showing X-ray diffraction results of piezoelectric thin films of Example 1 and Comparative Example 5.
Figure 9:
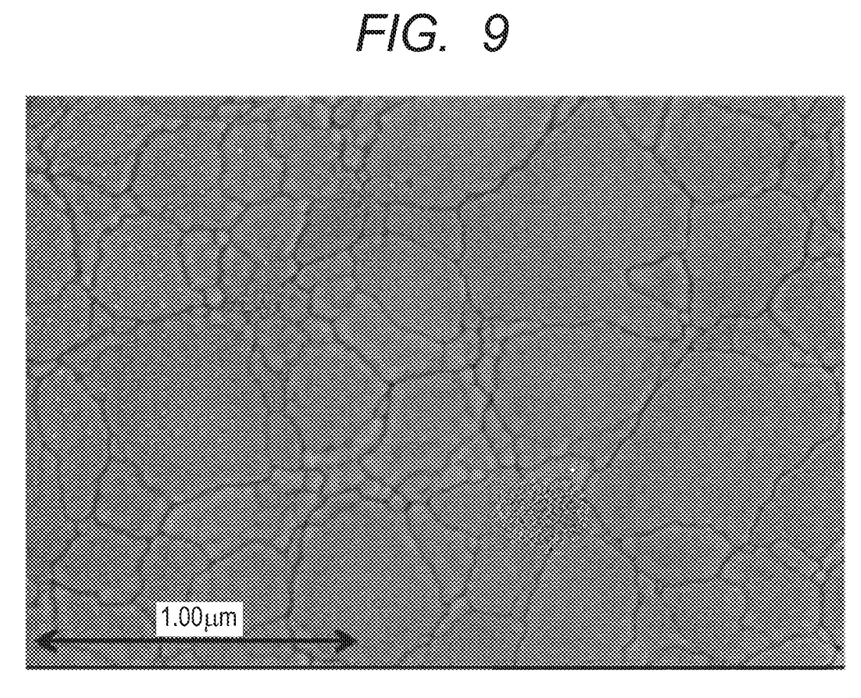
FIG. 9 is a surface electron micrograph of Example 1.
Figure 10:
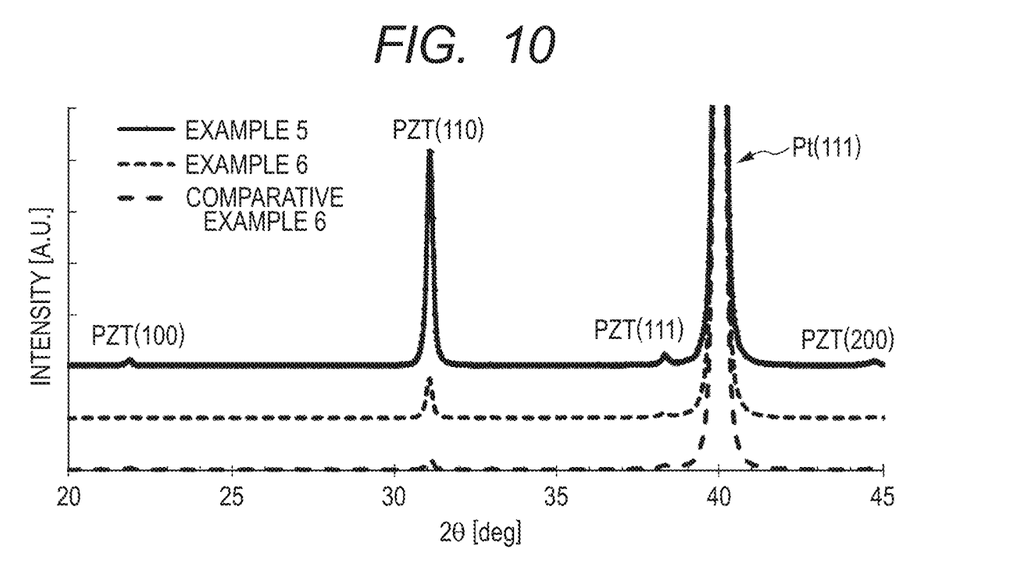
FIG. 10 is a graph for showing X-ray diffraction results of piezoelectric thin films of Examples 5 and 6 and Comparative Example 6.
Figure 11:
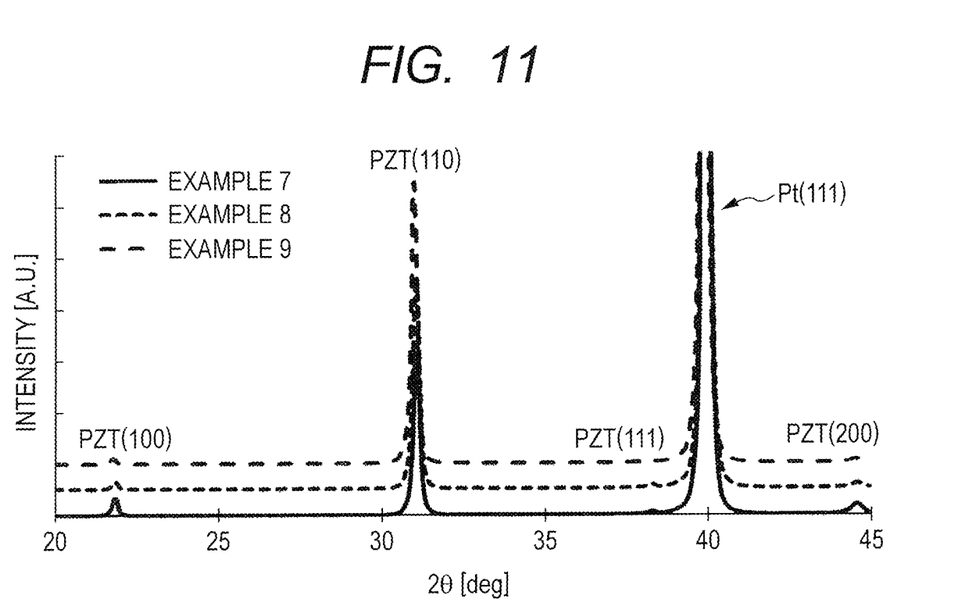
FIG. 11 is a graph for showing X-ray diffraction results of piezoelectric thin films of Examples 7 to 9.

Each of the piezoelectric thin films obtained in Examples 1 to 9 and Comparative Examples 1 to 6 was determined for a preferential orientation plane, an orientation degree, and an average particle diameter through use of the above-mentioned evaluation methods. The results are shown in Table 1. Further, the X-ray diffraction results of Examples 1 to 4 are shown in FIG. 5, and the X-ray diffraction results of Comparative Examples 1 to 4 are shown in FIG. 6. The X-ray diffraction results of the substrate having the Pt electrode formed thereon used in Example 1 and the substrate having the Pt electrode formed thereon used in Comparative Example 5 are shown in FIG. 7, and the X-ray diffraction results of Example 1 and Comparative Example 5 are shown in FIG. 8. Further, the surface electron micrograph of Example 1 is shown in FIG. 9, the X-ray diffraction results of Examples 5 and 6 and Comparative Example 6 are shown in FIG. 10, and the X-ray diffraction results of Examples 7 to 9 are shown in FIG. 11.

TABLE 1

| | Preferential orientation plane | Orientation ratio (%) 100 plane | Orientation ratio (%) 110 plane | Orientation ratio (%) 111 plane | Presence or absence of heating of Pt electrode | Drying condition of first coating liquid | Presence or absence of firing of first precursor layer | Drying condition of second coating liquid | Average particle diameter [μm] |
|---|---|---|---|---|---|---|---|---|---|
| Example 1 | 110 | 1.8 | 92.7 | 5.6 | No heating | HP at 150° C. for 5 minutes | No firing | HP at 340° C. for 5 minutes | 0.491 |
| Example 2 | 110 | 5.1 | 91.9 | 3.0 | No heating | HP at 340° C. for 5 minutes | No firing | HP at 340° C. for 5 minutes | 0.407 |
| Example 3 | 110 | 1.6 | 95.3 | 3.1 | No heating | HP at 360° C. for 5 minutes | No firing | HP at 340° C. for 5 minutes | 0.376 |
| Example 4 | 110 | 5.2 | 90.2 | 4.6 | No heating | HP at 280° C. for 5 minutes | No firing | HP at 360° C. for 5 minutes | 0.557 |
| Example 5 | 110 | 2.6 | 92.7 | 4.6 | No heating | HP at 200° C. for 5 minutes | No firing | HP at 340° C. for 5 minutes | 0.930 |
| Example 6 | 110 | 3.1 | 83.9 | 13.0 | No heating | HP at 280° C. for 5 minutes | No firing | HP at 340° C. for 5 minutes | 0.450 |
| Example 7 | 110 | 8.3 | 89.9 | 1.7 | No heating | HP at 150° C. for 5 minutes | No firing | HP at 330° C. for 5 minutes | 0.229 |
| Example 8 | 110 | 3.0 | 95.0 | 2.0 | No heating | HP at 150° C. for 30 minutes | No firing | HP at 330° C. for 5 minutes | 0.270 |
| Example 9 | 110 | 3.0 | 96.0 | 1.1 | No heating | HP at 150° C. for 5 minutes | No firing | HP at 330° C. for 30 minutes | 0.411 |
| Comparative Example 1 | 100 | 80.9 | 1.3 | 17.8 | No heating | — | — | HP at 340° C. for 5 minutes | 1.862 |
| Comparative Example 2 | 100 | 92.7 | 1.5 | 5.7 | No heating | HP at 150° C. for 5 minutes | RTA at 650° C. for 10 minutes | HP at 340° C. for 5 minutes | 0.301 |
| Comparative Example 3 | 100 | 93.7 | 0.7 | 5.6 | No heating | HP at 150° C. for 5 minutes | No firing | HP at 280° C. for 5 minutes | 0.241 |
| Comparative Example 4 | 111 | 0.1 | 0.3 | 99.6 | No heating | HP at 340° C. for 5 minutes | No firing | HP at 380° C. for 5 minutes | 0.287 |
| Comparative Example 5 | 111 | 0.8 | 34.8 | 64.4 | Heating treatment with HP at 400° C. | HP at 150° C. for 5 minutes | No firing | HP at 340° C. for 5 minutes | 0.376 |
| Comparative Example 6 | 110 | 8.3 | 65.2 | 26.4 | No heating | HP at 380° C. for 5 minutes | No firing | HP at 340° C. for 5 minutes | 0.720 |

Comparative Example 6

A piezoelectric thin film was obtained by the same procedure as that of Example 1 except that the temperature of the hot plate, at a time when the first coating liquid was applied and dried to form the first precursor layer, was set to In Examples, the first coating liquid was dried at a temperature within a range of from 150° C. to 360° C. without heating the Pt electrode, and the second coating liquid was dried at a temperature within a range of from 330° C. to 360° C. without firing the first precursor layer. Consequently, as shown in Table 1 and FIG. 5, FIG. 6, FIG. 10, and FIG. 11, it was confirmed that a PZT thin film which is grown largely on the (110) plane and which has a particle diameter as fine as 1 μm or less as shown in FIG. 9 is obtained.

Meanwhile, it was confirmed that, when there is no first precursor layer serving as the orientation control layer as in Comparative Example 1 or the first precursor layer receives large heat stress, for example, by being subjected to firing, thereby being crystallized as in Comparative Example 2, growth on the (110) plane does not occur. Further, it was also confirmed that, when the drying temperature of the second coating liquid is out of the above-mentioned range as in Comparative Examples 3 and 4, growth occurs in another orientation, and a PZT thin film preferentially oriented in the (110) plane is not obtained.

In addition, when the orientation control layer and the piezoelectric layer are formed after the Pt is crystallized as in Comparative Example 5, the growth of the (110) plane is suppressed as shown in Table 1 and FIG. 8. Therefore, it was also confirmed that it is necessary that the Pt lower electrode not be heated before the orientation control layer and the piezoelectric layer are formed in order to obtain a PZT thin film highly oriented in the (110) plane. It is understood from FIG. 7 and FIG. 8 that, in the piezoelectric substrate manufactured in Example 1, the Pt serving as the lower electrode changes in peak position of the (111) plane before and after the formation of the piezoelectric thin film. This is caused by the progression of the crystallization of the Pt when the first and second precursor layers are fired.

Further, it is understood that, when the drying temperature of the first precursor layer serving as the orientation control layer is more than 360° C. as in Comparative Example 6, the growth of the (110) plane is suppressed as seen in FIG. 10, and the ratio of the (110) plane is relatively decreased.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-120507, filed Jun. 17, 2016, and Japanese Patent Application No. 2017-023044, filed Feb. 10, 2017, which are hereby incorporated by reference herein in their entirety.

What is claimed is:

1. A piezoelectric substrate comprising:
   a substrate including a $SiO_2$ layer as an outermost surface layer;
   an intermediate layer made of one of Ti and $TiO_2$, which is formed on the $SiO_2$ layer of the substrate;
   a lower electrode made of Pt, which is formed on the intermediate layer;
   an orientation control layer containing lead titanate, which is formed on the lower electrode; and
   a piezoelectric layer, which is formed on the orientation control layer,
   the piezoelectric layer containing lead zirconate titanate having a composition represented by $Pb_x(Zr_{(y)}Ti_{(1-y)})O_3$, where $x=1.0$ to $1.2$ and $0.4<y<0.6$,
   the piezoelectric layer having a ratio of a reflection intensity of a (110) plane with respect to a total reflection intensity of a (100) plane, the (110) plane, and a (111) plane of 70% or more, which is measured by an X-ray diffraction method, and having an average particle diameter of crystal particles in a surface of 1.0 μm or less.

2. The piezoelectric substrate according to claim 1, wherein the intermediate layer has a thickness of 2 nm or more and 30 nm or less.

3. A liquid ejection head comprising:
   a piezoelectric substrate comprising:
      a substrate including a $SiO_2$ layer as an outermost surface layer;
      an intermediate layer made of one of Ti and $TiO_2$, which is formed on the $SiO_2$ layer of the substrate;
      a lower electrode made of Pt, which is formed on the intermediate layer;
      an orientation control layer containing lead titanate, which is formed on the lower electrode; and
      a piezoelectric layer, which is formed on the orientation control layer,
      the piezoelectric layer containing lead zirconate titanate having a composition represented by $Pb_x(Zr_{(y)}Ti_{(1-y)})O_3$, where $x=1.0$ to $1.2$ and $0.4<y<0.6$,
      the piezoelectric layer having a ratio of a reflection intensity of a (110) plane with respect to a total reflection intensity of a (100) plane, the (110) plane, and a (111) plane of 70% or more, which is measured by an X-ray diffraction method, and having an average particle diameter of crystal particles in a surface of 1.0 μm or less;
   a liquid ejection orifice configured to eject a liquid; and
   a pressure chamber communicating to the liquid ejection orifice.

* * * * *